United States Patent [19]

Greenberg et al.

[11] Patent Number: 4,793,282

[45] Date of Patent: Dec. 27, 1988

[54] DISTRIBUTOR BEAM FOR CHEMICAL VAPOR DEPOSITION ON GLASS

[75] Inventors: William M. Greenberg, Oregon; Dennis G. Maas; Randall L. Bauman, both of Perrysburg, all of Ohio

[73] Assignee: Libbey-Owens-Ford Co., Toledo, Ohio

[21] Appl. No.: 50,466

[22] Filed: May 18, 1987

[51] Int. Cl.⁴ .............................................. B05C 11/00
[52] U.S. Cl. ...................................... 118/667; 118/65; 118/69; 118/718; 118/719; 118/720; 118/728
[58] Field of Search .................. 118/667, 65, 69, 718, 118/719, 720, 728

Primary Examiner—Bernard Pianalto
Attorney, Agent, or Firm—Marshall & Melhorn

[57] ABSTRACT

A distributor beam for depositing coating material on the surface of a sheet of glass includes a plenum divided by a septum for separating different coating gases. Outlets for the gases are connected to an inlet to a mixing chamber for separating and redirecting the flow of the gases to thoroughly mix them into a coating material. A finger baffle having two sets of alternating finger elements extends across the width of the mixing chamber. Each finger element has one end closer to the plenum outlet than an opposite end. The plenum is surrounded by a cooling fluid duct and heating elements are provided for temperature control. Thermocouples generate signals representing desired temperatures and the heaters are controlled to maintain an optimum temperature for the gases as they flow from the plenum to the surface of the glass sheet which is located below an outlet from the mixing chamber.

22 Claims, 3 Drawing Sheets

DISTRIBUTOR BEAM FOR CHEMICAL VAPOR DEPOSITION ON GLASS

BACKGROUND OF THE INVENTION

The invention relates to an apparatus for coating glass and, in particular, to a temperature controlled distributor beam with a mixing baffle.

One method of coating flat glass is by contacting the glass with a gaseous coating material at substantially atmospheric pressure. However, it has been difficult to achieve uniform coatings on a moving glass ribbon by known techniques. In U.S. Pat. No. 3,850,679, it is proposed to enhance the uniformity of films produced by chemical vapor deposition by directing coating gas onto the glass surface through a nozzle at a Reynolds number of at least 2,500. For speed coating a continuous ribbon or sheet of glass, a Reynolds number of at least 5,000 for the flowing gas is recommended. The use of a Reynolds number above 2,500 means that the gas flow is turbulent.

A more satisfactory method of obtaining a uniform coating is to cause the coating gas to flow substantially parallel to the surface of a moving ribbon of glass to be coated under laminar flow conditions as opposed to turbulent flow conditions. A method and apparatus for achieving laminar flow conditions is disclosed in U.S. Pat. No. 4,469,045. The coating gas is directed onto a surface to be coated by a distributor extending across the upper surface of a moving ribbon of glass and across the direction of movement of the ribbon. This device is especially useful for applying a coating from a gas which reacts on contacting the hot glass surface to deposit a coating material on the glass, such as a metal vapor. The temperature of the gas supply and the distributor beam is preferably kept sufficiently high to prevent condensation of the coating gas, but sufficiently low to prevent any substantial decomposition or other deleterious reactions such as condensation, premature film deposition, or gas phase nucleation (powder formation) of the coating gas before the coating gas reaches the glass surface. The precise temperature control required is difficult to obtain.

SUMMARY OF THE INVENTION

The present invention concerns a method of and an apparatus for coating flat glass utilizing a distributor beam positioned above a moving ribbon of hot glass. Two separate reactant gases are directed to a plenum formed in the interior of the beam which plenum is divided into two chambers by a septum. Additional gases can be added by adding a septum for each one. The gases are separated by the septum as they flow from the plenum and through separate waffle packs or other flow distributing mechanisms such as baffle stacks to insure a uniform distribution across the width of the glass ribbon. The temperature of the plenum, and thus of the gases in the plenum, is controlled with water cooling and electric heaters.

The gases exiting the waffle packs enter a channel or duct which extends the length of the distributor beam and opens toward the upper surface of the glass ribbon. Thorough mixing of the two gases in the duct is achieved by a unique finger baffle in single or multiple stages. The duct is defined by a high thermal conductivity material such as graphite blocks which are insulated from the water cooled plenum and include electric heaters with thermocouple feedback. The temperature of the graphite blocks is maintained at a desired level by controlled heat transfer to the water cooled jacket and support around the plenum and by the use of the electric heaters.

BRIEF DESCRIPTION OF THE DRAWINGS

The above, as well as other advantages of the present invention, will become readily apparent to those killed in the art from the following detailed description of a preferred embodiment when considered in the light of the accompanying drawings, in which.

DESCRIPTION OF THE PREFERRED EMBODIMENT

Figure 1:
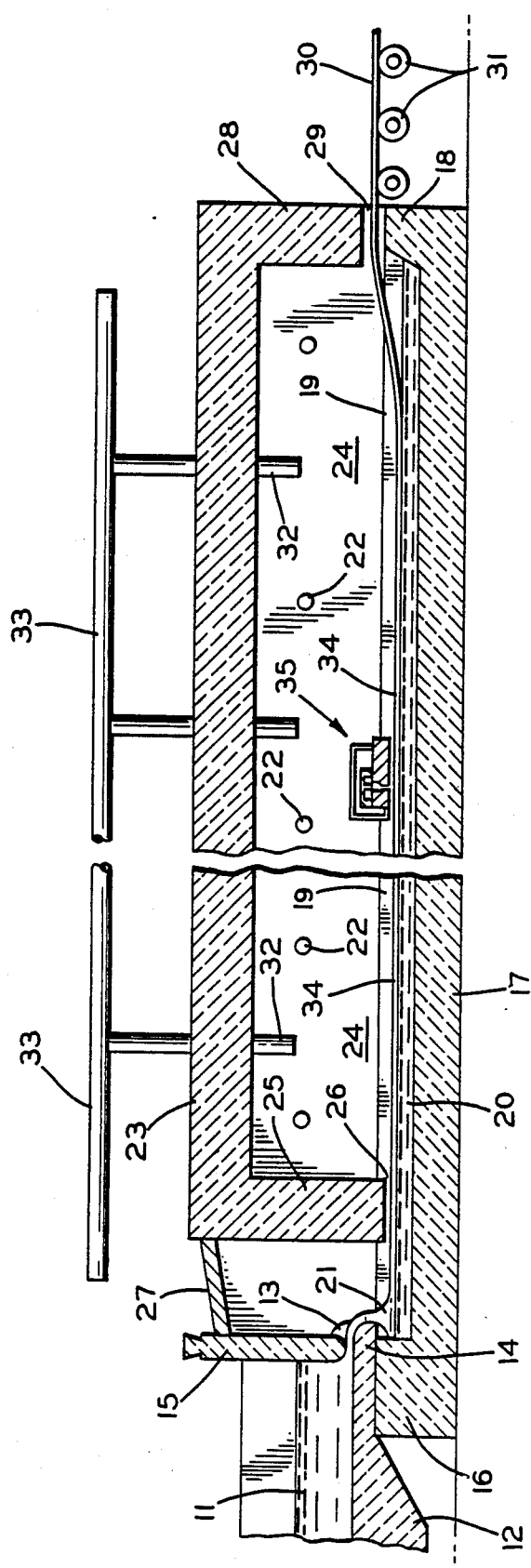
FIG. 1 is a side elevational view of a float glass manufacturing apparatus shown in cross-section and including a distributor beam in accordance with the present invention.

A distributor beam in accordance with the present invention can be utilized in applying a uniform coating to the upper surface of a ribbon of float glass. The position of the distributor beam with respect to the inlet and outlet ends of a bath upon which the ribbon floats depends upon the optimum temperature of the glass in relation to the material being deposited. The beam could also be used in the lehr if the temperatures and ambient atmosphere are suitable for coating chemistry. In FIG. 1, molten glass 11 is delivered in a conventional manner along a canal 12 leading from the outlet of a glass melting furnace (not shown). The canal 12 terminates in a spout having side jambs 13 and a lip 14. The flow the molten glass to the spout, usually soda-lime-silica glass, is controlled by a regulating tweel 15. The spout extends over an inlet end wall 16 of a tank structure comprising a floor 17, an outlet end wall 18 and sidewalls 19.

The tank structure contains a bath of molten metal 20, usually molten tin or tin alloy in which tin predominates, and molten glass flows at 21 over the spout lip 14 onto the surface of the molten metal bath 20 at the inlet of the bath. The temperature at the inlet is maintained in the region of one thousand degrees centigrade by heaters 22 mounted in a roof structure 23 which is supported over the tank structure and defines a head space 24 above the molten metal bath. The roof structure has an inlet end wall 25 which depends downwardly close to the surface of the molten bath 20 to define an inlet 26 of restricted height. An extension 27 of the roof structure 23 extends up to the tweel 15 to provide a chamber in which the spout is enclosed.

The roof structure 23 also has a downwardly depending wall 28 at the outlet end. An outlet 29 for a ribbon of glass 30 produced on the bath is defined between the lower face of the outlet end wall 28 of the roof structure and the upper face of the outlet end wall 18 of the bath. Driven traction rollers 31 are mounted beyond the outlet 29 with the upper surfaces of the rollers just above the level of the upper surface of the bath end wall 18 so that the ribbon of glass 30 is lifted gently from the bath surface for discharge horizontally away from the outlet 29 on the rollers 31.

A protective atmosphere, for example, 95% nitrogen and 5% hydrogen, is maintained at a plenum in the head space 24 over the bath, being supplied through ducts 32 extending downwardly through the roof 23 and connected to a common header 33. Protective atmosphere flows outwardly through the inlet 26 to fill the chamber under the extension 17 enclosing the spout.

A temperature gradient is maintained down the bath from the temperature of about one thousand degrees centigrade at the inlet end of the bath to a temperature in the range of about five hundred seventy degrees centigrade to six hundred fifty degrees centigrade at the outlet end where the ribbon of glass is discharged from the bath. At this lower temperature at the outlet, the glass is sufficiently stiffened to be unharmed by its contact with the traction rollers 31, but can still be lifted from the bath surface as illustrated.

The molten glass 11 which flows over the spout lip 14 and onto the bath at 21, is permitted to flow laterally on the bath to form a layer 34 of molten glass which is then advanced as a ribbon which is cooled and discharged from the bath. The width of the tank structure containing the bath between the sidewalls 19 is greater than the width of the ribbon.

A gas distributor beam 35 for supplying coating gas to the surface of the glass ribbon is located transversely of the path of travel of the ribbon of glass along the bath near the outlet end of the bath as illustrated in FIG. 1. The distributor thus extends across the upper surface of the ribbon of glass and across the direction of movement of the ribbon. The gas distributor beam 35 is illustrated in greater detail in FIG. 2.

The physical and chemical nature of the reactants used in many chemical vapor deposition (CVD) processes dictates that the gases, and hence the distributor beam surfaces, must be maintained within some precise temperature range or ranges. These requirements can arise because of condensation, premature film deposition, decomposition, and gas phase nucleation (powder formation) which can occur if the temperatures are not correctly maintained. In multi-component CVD systems, these conditions can be even more stringent, such as in the deposition of Ti-N films, where the two reactant streams must not only be kept in a narrow temperature range, but must be kept separate until just before they contact the glass surface.

Testing has indicated that a reactant temperature window of five hundred to six hundred fifty degrees Fahrenheit is desirable for the deposition of Ti-N reactants. Additionally, it also appears that the desirable temperature window for certain portions of the surfaces of the gas channel is between six hundred and nine hundred degrees Fahrenheit in order to minimize undesirable material deposition on the surfaces of the beam which can lead to flaking and disturbance of the uniformity of the coating.

Since the CVD distributor apparatus operates in an environment of about one thousand two hundred degrees Fahrenheit, the conventional approach has been to use cooling fluids that can operate at the desired temperatures of the beam surfaces such as oils and gases, and that will not decompose in a manner that destroys the distributor beam in case of a pump failure and uncontrolled temperature rise to one thousand two hundred degrees Fahrenheit. This design philosophy has led to expensive, dangerous or ill-controlled systems.

The present invention solves the prior art problems by providing a means of controlling the beam surfaces using normal pressure, liquid water cooling combined with easily controllable electric heat supplied near the surfaces of interest. One of the keys to achieving the desired results is the control of the thermal resistances between the beam members having the surfaces of interest and the water cooled supports. This is achieved by judicious choices of insulation material and cooled fastener means such that as the beam members increase in temperature, the thermal resistance of the interface between the members and the water cooled supports decreases.

The present invention provides a means of achieving a thorough mixing of two or more film precursors before the precursors contact the filming surface so that a higher film deposition efficiency and/or a higher film purity is achieved. Conventional means such as static in-line mixing operations before the reactants pass through the waffle pack leads to premature powder formation and clogging of the CVD apparatus. The linear static mixer baffle of the present invention circumvents this problem by its position in the precursor flow path being as close to the deposition surface as possible. This proximity to the glass surface must not be so close, however, that the turbulence induced by the mixer plates does not decay before the precursor stream contacts the glass surface.

The gas distributor beam 35 includes an inverted generally U-shaped channel member 36 having a substantially horizontal top wall 37 and downwardly depending side walls 38 and 39. Within the channel member 36 is positioned another inverted U-shaped channel member 40 having a generally horizontally extending top wall 41 and downwardly depending side walls 42 and 43. The lower ends of the side walls 39 and 43 are joined by a horizontal member 44 which can be attached by any convenient means such as welding. The lower ends of the side walls 38 and 42 are similarly attached to a horizontal member 45. Thus, the channel member 36, the channel member 40, the horizontal member 44, and the horizontal member 45 define a duct 46 for the passage of heat transfer fluids such as water. Although not shown, conventional inlet and outlet means can be connected to the duct 46 for supplying the heat transfer fluid at a lower temperature to the duct and removing the heat transfer fluid at a higher temperature from the duct. Also, one or more partitions could be formed in the duct 46 for defining separate passages for the heat transfer fluid. For example, a generally vertically extending wall could be formed between the top wall 36 and the horizontal member 45 to divide the area between the side walls 38 and 42 into separate passages with the area closer to the side wall 42 being for inlet heat transfer fluid and the area closer to the side wall 38 being for outlet heat transfer fluid flowing in opposite directions.

The structure defining the fluid duct 46 is attached to a pair of blocks defining an outlet passage for the coating gas to be directed toward the upper surface of the layer of molten glass 34. The blocks are formed of graphite or any other suitable high thermal conductivity material. For example, a lead-toe graphite block 47 has a generally vertically extending surface which faces the side wall 43. An attachment plate 48 abuts the side wall 43 and a sheet of insulation 49 is positioned between the attachment plate 48 and the lead-toe block 47. The lead-toe block 47 can be attached to the side wall 43 by cooled threaded fasteners (not shown). Similarly a center block 50 is attached along an upper surface to the horizontal member 45 by an attachment plate having a horizontally extending member 51a and a vertically extending member 51b abutting the side wall 38. A sheet of insulating material 52 is positioned between the block 50 and the attachment plate member 51a and cooled threaded fasteners (not shown) are utilized for attachment.

An attachment plate 53 is attached to a downwardly facing surface of the top wall 41. A sheet of insulation material 54 is attached to a downwardly facing surface of the attachment plate 53 and a heater block 55 is attached to a downwardly facing surface of the insulating material 54. Two of a plurality of resistive heater elements 56 are shown each positioned in an associated recess 57 formed in a side wall of the heater block 55. Each of the heaters 56 is connected to an electrical lead 58 which in turn is connected to a source of power (not shown) having control means for controlling the amount of heat generated by the electrical heaters 56.

A pair of U-shaped channel members 59 form a pair of adjacent plenums 60 and 61. Each of the channel members 59 has a top wall 62 attached to a downwardly facing surface of the heater block 55, an outer downwardly extending side wall 63 and an inner downwardly extending side wall 64. The inner side walls 64 are adjacent, but separated by a downwardly extending septum 65. An outside surface of each of the outer sidewalls 63 abuts an associated side block 66. Each of the side blocks 66 has an upper surface which abuts the downwardly facing surface of the heater block 55. An individual thermocouple 67 is associated with each of the heaters 56 and is positioned in a recess 68 formed in an outer side wall of the side block 66. Each thermocouple 67 is connected to an electrical lead 69 which in turn is connected to the control (not shown) for the heaters 56. Therefore, the power supplied to the heaters 56 can be controlled in accordance with the temperature sensed by the thermocouples 67 in order to maintain a uniform predetermined temperature in the structure surrounding the plenums 60 and 61.

A pair of support plates 70 each have an upwardly facing recess 71 formed therein for retaining the lower edges of the outer side walls 63 and the lower edges of the side blocks 66. The outer side walls 63 and the side blocks 66 are attached to the threaded fasteners (not shown). Each of the support plates 70 also has a downwardly extending flange 72 which abuts the upper surfaces of the lead-toe block 47 and the center block 50 and serves as a thrust plate for the waffle iron positioning bolts as described below. Thus, the attachment plate 53, the insulating material 54, the heater block 55, the U-shaped channels 59, the side blocks 66, and the support plate 70 form a plenum structure which extends between the downwardly facing surface of the top wall 41 and the upwardly facing surfaces of the blocks and is positioned between the side walls 42 and 43.

A pair of waffle irons 73 are positioned between a downwardly facing surface of each of the support plates 70 and an upwardly facing surface of the blocks 47 and 50. Horizontally extending positioning bolts are threadably engaged in the side surfaces of the waffle irons and each of the positioning bolts 74 has a head abutting an inwardly facing surface of a corresponding one of the flanges 72. Thus, by rotating the positioning bolts 74, the waffle irons 73 can be moved toward or away from facing sides of the septum 65 which extends between the waffle irons 73 and into a mixing chamber 75 defined between the lead-toe block 47 and the central block 50. A pair of waffle packs 7 are positioned between the septum 65 and each of the waffle irons 73. A one half to one inch extension of the septum 65 into the chamber 75 tends to prevent clogging of the waffle packs 76.

Figure 3:
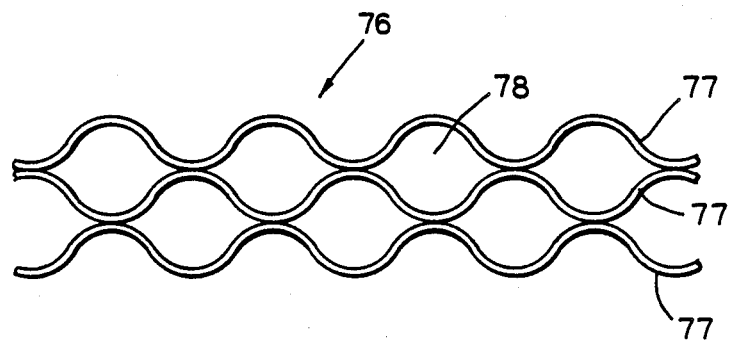
FIG. 3 is an enlarged fragmentary plan view of a waffle pack included in the distributor beam of FIG. 2.

As best shown in FIG. 3, the waffle packs 76 are formed of a plurality of similar crimped metal strips 77 arranged "out of phase" to define a plurality of channels 78 which are of small cross-sectional area relative to the cross-sectional area of the plenums 60 and 61. Thus, when coating gas is supplied under pressure to the plenums 60 and 61, the pressure drop along the plenums is small compared to the pressure drop through the restricted channels 78. The waffle plates 76 effectively constitute gas flow restrictor means to insure release of coating gas at a substantially constant pressure and temperature along the whole of its length, and hence uniformly across the width of the glass to be coated. As shown by the arrows, the gases supplied to the plenums 60 and 61 are separated by the septum 65 and flow through associated ones of the waffle packs 76 into the upper portion of the mixing chamber 75. Baffle stacks or any other suitable means for achieving a uniform flow could be used in place of the waffle packs.

Figure 4:
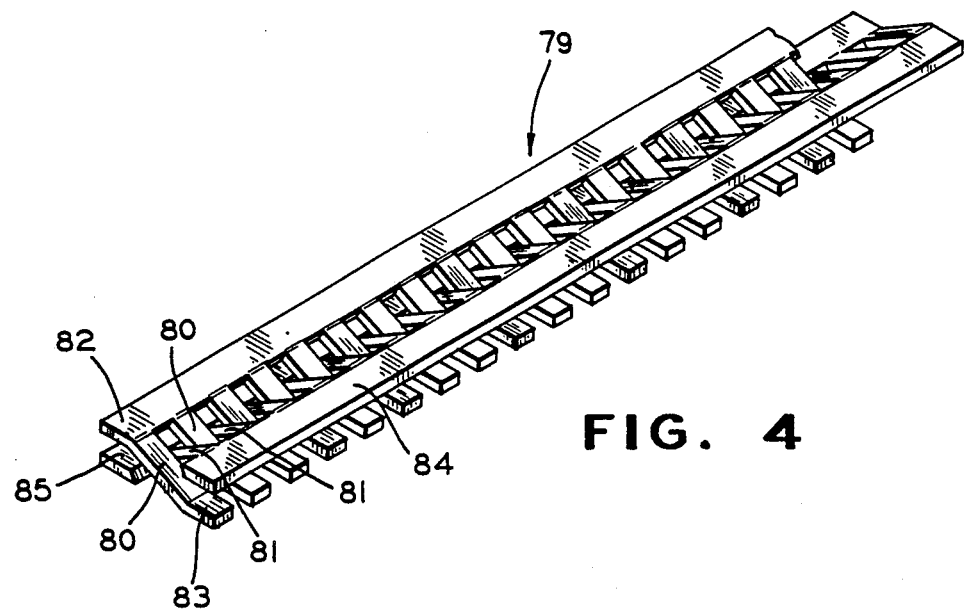
FIG. 4 is an enlarged fragmentary perspective view of a finger baffle shown in FIG. 2.

The two separate gases from the plenums 60 and 61 enter the upper portion of the mixing chamber 75 and contact a linear static mixer baffle or a finger baffle 79 which extends across the width of the mixing chamber 75. A best shown in FIG. 4, the finger baffle 79 includes two sets of alternating angled fingers 80 and 81. Each of the fingers 80 is connected at an upper end to a generally horizontally extending connector strip 82 which is secured in the block 47. Each of the fingers 80 extends downwardly at an angle with respect to the horizontal across the width of the mixing chamber 75 and terminates in a generally horizontally extending foot 83 Each of the feet 83 can be slidingly retained in the block 50. Each of the fingers 81 extends between an upper connector strip 84 and a lower connector strip 85. The upper connector strip 84 is generally horizontally extending and is secured in the block 50. The fingers 81 then extend downwardly at angle and terminate at the lower connector strip 85 which is generally horizontally extending and is retained in the block 47. Obviously, the connector strip 82 and the feet 83 could be reversed, one of the connector strips 84 and 85 could be formed instead as feet similar to the feet 83, and if one of the connector strips 84 and 85 were formed as feet, the feet 83 could be formed as a connector strip.

Gas flowing from the plenum 60 through the associated waffle pack 76 first encounters the one end of the fingers 80 closer to the plenum outlet. Half of the gas will strike the fingers 80 and be directed toward the opposite side of the mixing chamber 75. The other half of such gas will flow between the fingers 80 and strike the lower ends of the fingers 81. At the same time, the gas flowing from the plenum 61 through its associated waffle pack 76 encounters the one end of the fingers 8 closer to the plenum outlet. Half of the gas strikes the fingers 81 and is directed toward the opposite side of the mixing chamber 75 while the other half of the gas flows between the fingers 81 and strikes the lower ends of the fingers 80. Such splitting of the two elongated gas streams into multiple streams and the redirecting of half of the flows tends to thoroughly mix the two gases which mixture exits the bottom of the finger baffle 79 and flows into a distribution slot 86 defined between the facing surfaces of the block 47 and the block 50. Although one finger baffle 79 is shown, additional finger baffles could be positioned above and/or below if required for additional mixing.

Figure 2:
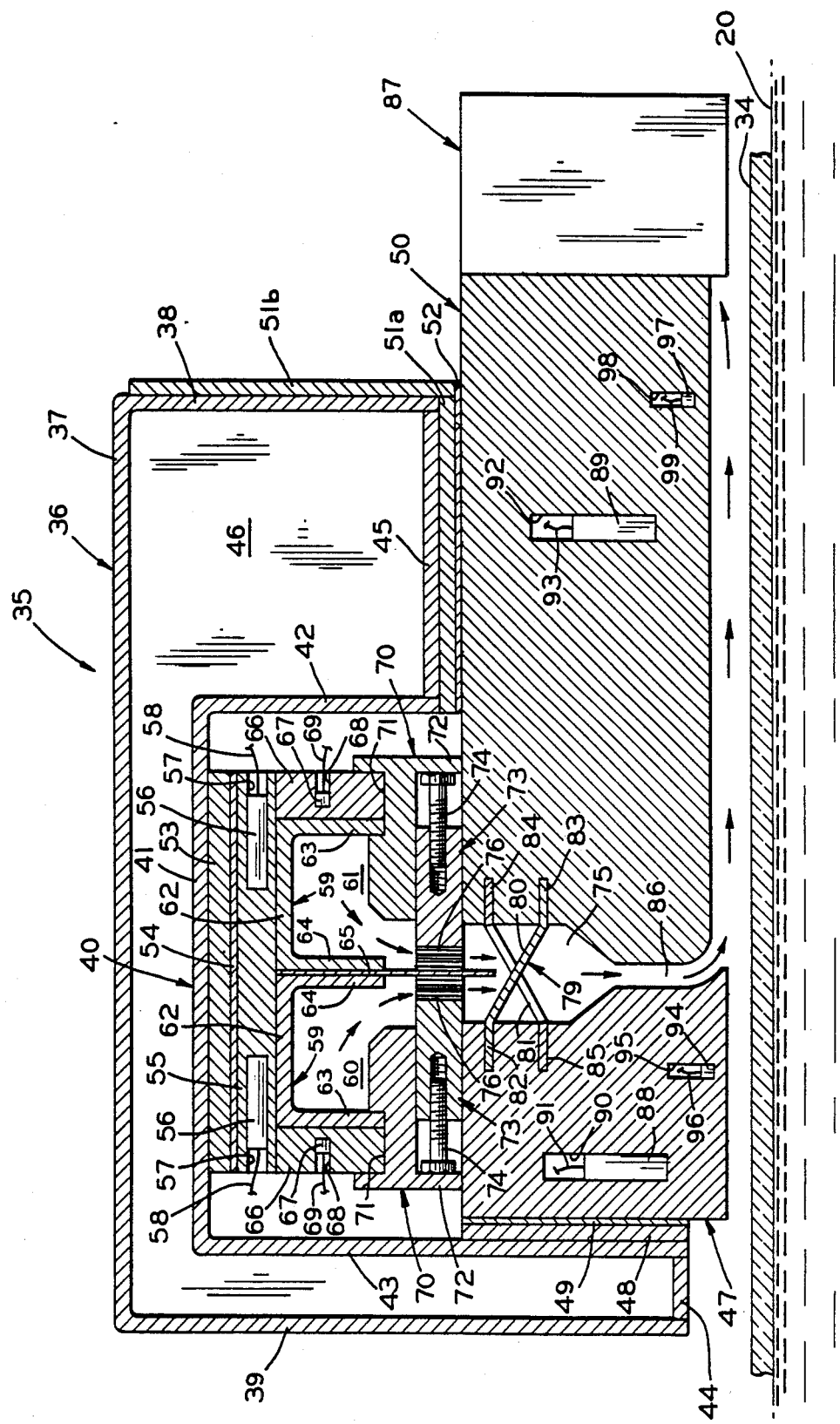
FIG. 2 is an enlarged side elevational cross-sectional view of the distributor beam shown in FIG. 1.

The lead-toe block 47 extends below the lower surface of the central block 50 and is shaped to redirect the vertically downwardly flowing gas to a horizontal laminar flow between the lower surface of the central block 50 and the upper surface of the sheet of molten glass 34. In FIG. 2, the sheet 34 is moving in the direction of the arrows and tends to pull the gas along with it from the side of the block 50 defining the mixing chamber 75 and the distribution slot 86 toward the opposite side to which there is attached a means 87 for collecting that portion of the gas mixture which is not deposited on the surface of the sheet 34. The collection means 87 can be of any conventional type including a graphite block 53 as shown in U.S. Pat. No. 4,469,045 or the vacuum device shown in U.S. Pat. No. 4,504,526.

In order to maintain a proper temperature for depositing the coating material on the surface of the sheet 34 and minimizing undesirable deposits on the blocks, each of the blocks 47 and 50 can be provided with a plurality of heating means such as a heater 88 positioned in the block 47 and a heater 89 positioned in the block 50. The heater 88 is located in a recess 90 formed in the block 47 and is connected to an electrical lead 91 which in turn is connected to the control apparatus (not shown) for supplying electrical power to the heater. Similarly, the heater 89 is located in a recess 92 and is connected to an electrical lead 93 which in turn is connected to the control apparatus (not shown). A thermocouple 94 can be positioned in a recess 95 formed in the block 47. The thermocouple 94 can be connected to an electrical lead 96 which in turn is connected to the control apparatus (not shown). Thus, the heater 88 can be controlled in accordance with the temperature sensed by the thermocouple 94 to maintain a desired temperature in the block 47 adjacent the upper surface of the strip of molten glass 34. Similarly, a thermocouple 97 can be located in a recess 98 formed in the block 50. The thermocouple 97 is connected to an electrical lead 99 which in turn is connected to the control apparatus (not shown). Thus, the control apparatus can control the power supplied to the heater 89 in accordance to the temperature sensed by the thermocouple 97 in order to maintain a desired temperature between the carbon block 50 and the upper surface of the sheet of molten glass 34.

The distributor beam 35 includes both cooling and heating means for maintaining the optimum temperature for the coating gases both in the plenums 60 and 61 and adjacent the surface to be coated on the sheet of molten glass 34. Complete mixing of the two constituent gases is achieved in the mixing chamber 75 by splitting the two parallel, elongated vertical streams of gas each into a plurality of streams with alternating ones of the streams directed toward the streams of the other gas. The splitting and redirection is performed utilizing an elongated finger baffle extending across the width of the mixing chamber with alternate fingers angled downwardly in opposite directions.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:
1. An apparatus for coating a surface of a sheet of glass by deposition of a coating material comprising:
   a first plenum for receiving a first coating gas and having an outlet;
   a second plenum for receiving a second coating gas and having an outlet;
   a mixing chamber having an inlet connected to said first plenum outlet and said second plenum outlet, and an outlet adapted to be positioned adjacent a surface of a sheet of glass to be coated; and
   a finger baffle positioned in said mixing chamber for mixing the first coating gas and the second coating gas to form a coating material, said finger baffle including at least two finger elements each extending across said mixing chamber and having one end located closer to said mixing chamber inlet than an opposite end.

2. The apparatus according to claim 1 including a septum extending between and separating said first and second plenums.

3. The apparatus according to claim 2 wherein said septum extends through said mixing chamber inlet and terminates adjacent said finger baffle.

4. The apparatus according to claim 1 wherein said finger baffle includes a first plurality of finger elements each having one end attached to a generally horizontally extending strip and an opposite end terminating in a generally horizontally extending foot, said strip and said feet being retained in opposite walls of said mixing chamber.

5. The apparatus according to claim 4 wherein said strip is located closer to said mixing chamber inlet than said feet.

6. The apparatus according to claim 4 wherein said first plurality of finger elements are spaced apart and including a second plurality of finger elements alternating with said first plurality of finger elements, one end of each of said second plurality of finger elements being retained in a wall of said mixing chamber in which said strip is retained and an opposite end being retained in a wall of said mixing chamber in which said feet are retained, said opposite ends of said second plurality of finger elements being closer to said mixing chamber inlet than said one ends of said second plurality of finger elements.

7. The apparatus according to claim 1 including cooling means positioned adjacent said first and second plenums for cooling said first and second coating gases.

8. The apparatus according to claim 7 including heating means positioned adjacent said first and second plenums for heating said first and second coating gases.

9. The apparatus according to claim 8 including temperature sensing means for generating at least one signal representing the temperatures of said first and second coating gases.

10. An apparatus for coating a surface of a moving sheet of glass by deposition of a coating material directed at an upper surface of the glass comprising:
    a first plenum for receiving a first coating gas and having an outlet;
    a second plenum for receiving a second coating gas and having an outlet;
    a septum extending between and separating said first and second plenums;

a mixing chamber having an inlet connected to said first and second plenum outlets and an outlet adapted to be positioned above an upper surface of a moving sheet of glass; and mixing means positioned in said mixing chamber for mixing said first and second coating gases to form a coating material at said mixing chamber outlet, said mixing means including a plurality of finger elements having alternate elements across said mixing chamber in opposite angular directions with respect to a direction of flow of said first and second coating gases from said mixing chamber inlet to said mixing chamber outlet.

11. The apparatus according to claim 10 including temperature control means for maintaining a desired coating gas temperature in said first and second plenums.

12. The apparatus according to claim 10 wherein said temperature control means includes a cooling duct formed about said first and second plenums for containing a heat transfer fluid to convey heat away from said first and second coating gases.

13. The apparatus according to claim 10 wherein said temperature control means includes heating means positioned adjacent said first and second plenums for adding heat to said first and second coating gases.

14. The apparatus according to claim 10 wherein said temperature control means includes thermocouple means for generating a signal representing the temperatures of said first and second coating gases.

15. The apparatus according to claim 10 including waffle pack means positioned between said first and second plenum outlets and said mixing chamber inlet.

16. An apparatus for depositing a coating material on a surface of a glass sheet comprising:

a plenum divided by a septum separating first and second coating gases and defining an outlet for each of said coating gases;

a mixing chamber having an inlet connected to said plenum outlets and an outlet for a coating material; and mixing means positioned between said mixing chamber inlet and said mixing chamber outlet for mixing said first and second coating gases to form a coating material and having one end positioned closer to said mixing chamber than an opposite end, said mixing means including a plurality of finger elements each having said one end and said opposite end, at least one of said finger elements having said one end positioned adjacent said plenum outlet for said first coating gas and at least another one of said finger elements having said one end positioned adjacent said plenum outlet for said second coating gas.

17. The apparatus according to claim 16 wherein each said one end of each of said finger elements extends in a direction generally transverse to a direction of flow of said first and second coating gases through mixing chamber and said one ends are retained in an associated wall of said mixing chamber.

18. The apparatus according to claim 16 wherein a first set of said plurality of finger elements each have said one end positioned adjacent said plenum outlet for said first coating gas and at least one of said one end and said opposite end extends in a direction generally transverse to a direction of flow of said first and second coating gases through said mixing chamber and is retained in an associated wall of said mixing chamber.

19. The apparatus according to claim 18 wherein at least one of said one end and said opposite end for each of said finger elements in said first set is formed as a portion of a strip connecting all of said finger elements in said first set.

20. The apparatus according to claim 16 wherein a first set of said plurality of finger elements each have said one end formed as a portion of a strip positioned adjacent said first coating gas outlet and both said one end and said opposite end extend in a direction generally transverse to a direction of flow of said first and second coating gases through said mixing chamber.

21. The apparatus according to claim 20 wherein a second set of said plurality of finger elements each have said one end formed as a portion of a strip positioned adjacent said second coating gas outlet and both said one end and said opposite end extend in a direction generally transverse to said direction of flow.

22. The apparatus according to claim 21 wherein said finger elements of said first and second sets are positioned alternately along a longitudinal axis transverse to said direction of flow.

* * * * *